US012776370B2

(12) United States Patent
Rajagiri et al.

(10) Patent No.: US 12,776,370 B2
(45) Date of Patent: Oct. 27, 2026

(54) MEMORY PILLAR SELECTION TRANSISTOR EVALUATION

(71) Applicant: Micron Technology, Inc., Boise, ID (US)

(72) Inventors: Avinash Rajagiri, Boise, ID (US); Pitamber Shukla, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 154 days.

(21) Appl. No.: 18/640,902

(22) Filed: Apr. 19, 2024

(65) Prior Publication Data

US 2024/0355392 A1 Oct. 24, 2024

Related U.S. Application Data

(60) Provisional application No. 63/461,448, filed on Apr. 24, 2023.

(51) Int. Cl.

| | |
|---|---|
| ***G11C 16/04*** | (2006.01) |
| ***G11C 16/10*** | (2006.01) |
| ***H10B 43/10*** | (2023.01) |
| ***H10B 43/27*** | (2023.01) |
| ***H10B 43/35*** | (2023.01) |

(52) U.S. Cl.

CPC .......... *G11C 16/0483* (2013.01); *G11C 16/10* (2013.01); *H10B 43/10* (2023.02); *H10B 43/27* (2023.02); *H10B 43/35* (2023.02)

(58) Field of Classification Search

CPC .... G11C 16/0483; G11C 16/10; H10B 43/35; H10B 43/10; H10B 43/27

USPC .................................................. 365/189.011

See application file for complete search history.

(56) References Cited

U.S. PATENT DOCUMENTS

| | | | | |
|---|---|---|---|---|
| 2019/0108119 A1* | 4/2019 | Gholamipour | ........ | G06F 3/0616 |
| 2021/0249085 A1* | 8/2021 | Hong | .................... | G06F 3/0679 |
| 2021/0358546 A1* | 11/2021 | Sinipete | ............. | G11C 13/0004 |
| 2022/0415409 A1* | 12/2022 | Sebastiani | ........... | G11C 11/5678 |

* cited by examiner

*Primary Examiner* — Amir Zarabian
*Assistant Examiner* — Daniel John King
(74) *Attorney, Agent, or Firm* — Holland & Hart LLP

(57) ABSTRACT

Methods, systems, and devices for memory pillar selection transistor evaluation are described. A memory system may be configured to monitor threshold voltage characteristics of pillar selection transistors, which may include evaluations relative to certain subsets of the pillar selection transistors. For example, an activation voltage may be applied to the pillar selection transistors to determine whether threshold voltages associated with each subset of pillar selection transistors have shifted. Determining whether the threshold voltages have shifted may include determining whether an access parameter has been satisfied, such as a duration to program memory cells. For example, a relatively long duration may indicate that channels associated with pillar selection transistors have become less conductive for a given activation voltage.

20 Claims, 6 Drawing Sheets

MEMORY PILLAR SELECTION TRANSISTOR EVALUATION

CROSS REFERENCE

The present Application for patent claims priority to U.S. Patent Application No. 63/461,448 by Rajagiri et al., entitled "MEMORY PILLAR SELECTION TRANSISTOR EVALUATION," filed Apr. 24, 2023, which is assigned to the assignee hereof, and which is expressly incorporated by reference in its entirety herein.

TECHNICAL FIELD

The following relates to one or more systems for memory, including memory pillar selection transistor evaluation.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not- and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
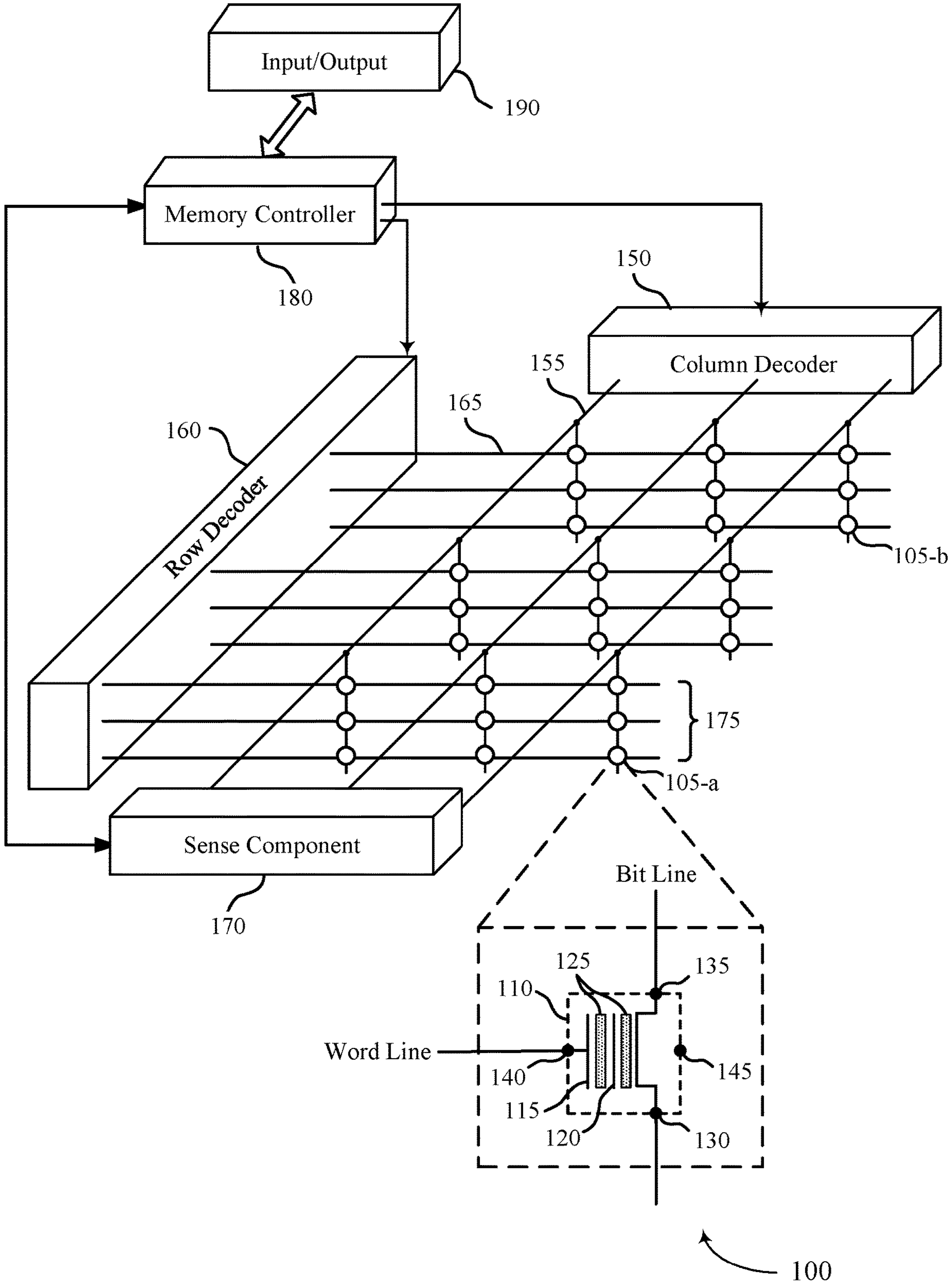
FIG. 1 illustrates an example of a system that supports memory pillar selection transistor evaluation in accordance with examples as disclosed herein.

In some memory architectures, a memory device may include blocks of memory cells arranged in a three-dimensional architecture. For example, subsets of memory cells (e.g., strings of memory cells) of a block may be arranged in pillars along a direction away from a substrate. A pillar may be selected by activating a corresponding pillar selection transistor (e.g., by applying an activation voltage to a gate of the pillar selection transistor that is greater than or equal to a threshold voltage of the pillar selection transistor), which may couple the pillar with a corresponding access line. However, threshold voltages of pillar selection transistors may change (e.g., increase, decrease) over time, which may change a level of conductivity through channels of the pillar selection transistors for a given activation voltage that is applied to gates of the pillar selection transistors. In some examples, threshold voltages of certain subsets of pillar selection transistors may change more quickly or to a greater degree than other subsets. For example, in some arrangements of blocks, threshold voltages of pillar selection transistors located relatively closer to isolation regions of or between blocks may change more quickly or to a greater degree than pillar selection transistors that are relatively farther from such isolation regions.

In accordance with examples as described herein, a memory system may be configured to monitor threshold voltage characteristics of pillar selection transistors, which may include evaluations relative to certain subsets of such pillar selection transistors (e.g., distinguishing subsets of multiple pillar selection transistors by type, by location, or by physical address). For example, an activation voltage may be applied to the pillar selection transistors to determine whether the threshold voltages associated with each subset of the pillar selection transistors have shifted (e.g., by comparing observed threshold voltages to a threshold, by evaluating operations associated with a channel conductivity of the pillar selection transistors during application of the activation voltage). In some cases, determining whether the threshold voltages of each subset of pillar selection transistors have shifted may include determining whether an access parameter has been satisfied. For example, an access parameter may be associated with a duration (e.g., a quantity of programming pulses) to program the memory cells corresponding to a subset of pillar selection transistors, such that a relatively long duration to program the memory cells may indicate that channels associated with the pillar selection transistors have become less conductive for a given activation voltage. In some examples, the access parameter may be associated with an aggregate value (e.g., an average value, a minimum value, a maximum value) associated with the subset of pillar selection transistors, such that a relatively high aggregate value may indicate greater degradation of the subset of pillar selection transistors. In some implementations, such evaluations may include comparing access parameters between one subset of transistors and another subset of transistors. Evaluating certain subsets of the pillar selection transistors of a block may support a more-detailed understanding of degradation than an aggregate evaluation of pillar selection transistors of a block, which may provide an earlier indication of degradation and improve reliability by retiring or otherwise modifying operation of memory blocks.

Features of the disclosure are initially described in the context of systems, devices, and circuits. Features of the disclosure are further described in the context of memory architectures and a flowchart.

FIG. 1 illustrates an example of a memory device 100 that supports memory pillar selection transistor evaluation in accordance with examples as disclosed herein. FIG. 1 is an illustrative representation of various components and features of the memory device 100. As such, the components and features of the memory device 100 are shown to illustrate functional interrelationships, and not necessarily physical positions within the memory device 100. Further, although some elements included in FIG. 1 are labeled with a numeric indicator, some other corresponding elements are not labeled, even though they are the same or would be understood to be similar, in an effort to increase visibility and clarity of the depicted features.

The memory device 100 may include one or more memory cells 105, such as memory cell 105-*a* and memory cell 105-*b*. In some examples, a memory cell 105 may be a NAND memory cell, such as in the blow-up diagram of memory cell 105-*a*. Each memory cell 105 may be programmed to store a logic value representing one or more bits of information. In some examples, a single memory cell 105—such as a memory cell 105 configured as a single-level cell (SLC)—may be programmed to one of two supported states and thus may store one bit of information at a time (e.g., a logic 0 or a logic 1). In some other examples, a single memory cell 105—such a memory cell 105 configured as a multi-level cell (MLC), a tri-level cell (TLC), a quad-level cell (QLC), or other type of multiple-level memory cell 105—may be programmed to one state of more than two supported states and thus may store more than one bit of information at a time. In some cases, a multiple-level memory cell 105 (e.g., an MLC memory cell, a TLC memory cell, a QLC memory cell) may be physically different than an SLC cell. For example, a multiple-level memory cell 105 may use a different cell geometry or may be fabricated using different materials. In some examples, a multiple-level memory cell 105 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

In some NAND memory arrays, each memory cell 105 may be illustrated as a transistor that includes a charge trapping structure (e.g., a floating gate, a replacement gate, a dielectric material) for storing an amount of charge representative of a logic value. For example, the blow-up in FIG. 1 illustrates a NAND memory cell 105-*a* that includes a transistor 110 (e.g., a metal-oxide-semiconductor (MOS) transistor) that may be used to store a logic value. The transistor 110 may include a control gate 115 and a charge trapping structure 120 (e.g., a floating gate, a replacement gate), where the charge trapping structure 120 may, in some examples, be between two portions of dielectric material 125. The transistor 110 also may include a first node 130 (e.g., a source or drain) and a second node 135 (e.g., a drain or source). A logic value may be stored in transistor 110 by storing (e.g., writing) a quantity of electrons (e.g., an amount of charge) on the charge trapping structure 120. An amount of charge to be stored on the charge trapping structure 120 may depend on the logic value to be stored. The charge stored on the charge trapping structure 120 may affect the threshold voltage of the transistor 110, thereby affecting the amount of current that flows through the transistor 110 when the transistor 110 is activated (e.g., when a voltage is applied to the control gate 115, when the memory cell 105-*a* is read). In some examples, the charge trapping structure 120 may be an example of a floating gate or a replacement gate that may be part of a 2D NAND structure. For example, a 2D NAND array may include multiple control gates 115 and charge trapping structures 120 arranged around a single channel (e.g., a horizontal channel, a vertical channel, a columnar channel, a pillar channel).

A logic value stored in the transistor 110 may be sensed (e.g., as part of a read operation) by applying a voltage to the control gate 115 (e.g., to control node 140, via a word line 165) to activate the transistor 110 and measuring (e.g., detecting, sensing) an amount of current that flows through the first node 130 or the second node 135 (e.g., via a bit line 155). For example, a sense component 170 may determine whether an SLC memory cell 105 stores a logic 0 or a logic 1 in a binary manner (e.g., based on a presence or absence of a current through the memory cell 105 when a read voltage is applied to the control gate 115, based on whether the current is above or below a threshold current). For a multiple-level memory cell 105, a sense component 170 may determine a logic value stored in the memory cell 105 based on various intermediate threshold levels of current when a read voltage is applied to the control gate 115, or by applying different read voltages to the control gate and evaluating different resulting levels of current through the transistor 110, or various combinations thereof. In one example of a multiple-level architecture, a sense component 170 may determine the logic value of a TLC memory cell 105 based on eight different levels of current, or ranges of current, that define the eight potential logic values that could be stored by the TLC memory cell 105.

An SLC memory cell 105 may be written by applying one of two voltages (e.g., a voltage above a threshold or a voltage below a threshold) to the memory cell 105 to store, or not store, an electric charge on the charge trapping structure 120 and thereby cause the memory cell 105 to store one of two possible logic values. For example, when a first voltage is applied to the control node 140 (e.g., via a word line 165) relative to a bulk node 145 (e.g., a body node) for the transistor 110 (e.g., when the control node 140 is at a higher voltage than the bulk), electrons may tunnel into the charge trapping structure 120. Injection of electrons into the charge trapping structure 120 may be referred to as programming the memory cell 105 and may occur as part of a write operation. A programmed memory cell may, in some cases, be considered as storing a logic 0. When a second voltage is applied to the control node 140 (e.g., via the word line 165) relative to the bulk node 145 for the transistor 110 (e.g., when the control node 140 is at a lower voltage than the bulk node 145), electrons may leave the charge trapping structure 120. Removal of electrons from the charge trapping structure 120 may be referred to as erasing the memory cell 105 and may occur as part of an erase operation. An erased memory cell may, in some cases, be considered as storing a logic 1. In some cases, memory cells 105 may be programmed at a page level of granularity due to memory cells 105 of a page sharing a common word line 165, and memory cells 105 may be erased at a block level of granularity due to memory cells 105 of a block sharing commonly biased bulk nodes 145.

In contrast to writing an SLC memory cell 105, writing a multiple-level (e.g., MLC, TLC, or QLC) memory cell 105 may involve applying different voltages to the memory cell 105 (e.g., to the control node 140 or bulk node 145 thereof) at a finer level of granularity to more finely control the amount of charge stored on the charge trapping structure 120, thereby enabling a larger set of logic values to be represented. Thus, multiple-level memory cells 105 may provide greater density of storage relative to SLC memory cells 105 but may, in some cases, involve narrower read or write margins or greater complexities for supporting circuitry.

A charge-trapping NAND memory cell 105 may operate similarly to a floating-gate NAND memory cell 105 but, instead of or in addition to storing a charge on a charge trapping structure 120, a charge-trapping NAND memory cell 105 may store a charge representing a logic state in a dielectric material between the control gate 115 and a channel (e.g., a channel between a first node 130 and a second node 135). Thus, a charge-trapping NAND memory cell 105 may include a charge trapping structure 120, or may implement charge trapping functionality in one or more portions of dielectric material 125, among other configurations.

In some examples, each page of memory cells 105 may be connected to a corresponding word line 165, and each column of memory cells 105 may be connected to a corresponding bit line 155 (e.g., digit line). Thus, one memory cell 105 may be located at the intersection of a word line 165 and a bit line 155. This intersection may be referred to as an address of a memory cell 105. In some cases, word lines 165 and bit lines 155 may be substantially perpendicular to one another, and may be generically referred to as access lines or select lines.

In some cases, a memory device 100 may include a three-dimensional (3D) memory array, where multiple two-dimensional (2D) memory arrays may be formed on top of one another. In some examples, such an arrangement may increase the quantity of memory cells 105 that may be fabricated on a single die or substrate as compared with 1D arrays, which, in turn, may reduce production costs, or increase the performance of the memory array, or both. In the example of FIG. 1, memory device 100 includes multiple levels (e.g., decks, layers, planes, tiers) of memory cells 105. The levels may, in some examples, be separated by an electrically insulating material. Each level may be aligned or positioned so that memory cells 105 may be aligned (e.g., exactly aligned, overlapping, or approximately aligned) with one another across each level, forming a memory cell stack 175. In some cases, memory cells aligned along a memory cell stack 175 may be referred to as a string of memory cells 105 (e.g., as described with reference to FIG. 2).

Accessing memory cells 105 may be controlled through a row decoder 160 and a column decoder 150. For example, the row decoder 160 may receive a row address from the memory controller 180 and activate an appropriate word line 165 based on the received row address. Similarly, the column decoder 150 may receive a column address from the memory controller 180 and activate an appropriate bit line 155. Thus, by activating one word line 165 and one bit line 155, one memory cell 105 may be accessed. As part of such accessing, a memory cell 105 may be read (e.g., sensed) by sense component 170. For example, the sense component 170 may be configured to determine the stored logic value of a memory cell 105 based on a signal generated by accessing the memory cell 105. The signal may include a current, a voltage, or both a current and a voltage on the bit line 155 for the memory cell 105 and may depend on the logic value stored by the memory cell 105. The sense component 170 may include various circuitry (e.g., transistors, amplifiers) configured to detect and amplify a signal (e.g., a current or voltage) on a bit line 155. The logic value of memory cell 105 as detected by the sense component 170 may be output via input/output component 190. In some cases, a sense component 170 may be a part of a column decoder 150 or a row decoder 160, or a sense component 170 may otherwise be connected to or in electronic communication with a column decoder 150 or a row decoder 160.

A memory cell 105 may be programmed or written by activating the relevant word line 165 and bit line 155 to enable a logic value (e.g., representing one or more bits of information) to be stored in the memory cell 105. A column decoder 150 or a row decoder 160 may accept data (e.g., from the input/output component 190) to be written to the memory cells 105. In the case of NAND memory, a memory cell 105 may be written by storing electrons in a charge trapping structure or an insulating layer.

A memory controller 180 may control the operation (e.g., read, write, re-write, refresh) of memory cells 105 through the various components (e.g., row decoder 160, column decoder 150, sense component 170). In some cases, one or more of a row decoder 160, a column decoder 150, and a sense component 170 may be co-located with a memory controller 180. A memory controller 180 may generate row and column address signals in order to activate a desired word line 165 and bit line 155. In some examples, a memory controller 180 may generate and control various voltages or currents used during the operation of memory device 100.

In some cases, memory cells 105 may be arranged in pillars (e.g., strings of memory cells 105), and each pillar of memory cells 105 may be coupled with a respective bit line 155 via a pillar selection transistor between the pillar and the bit line 155. In some examples, a pillar selection transistor may have a configuration similar to a transistor 110, such as when pillar selection transistors and memory cells 105 are formed in accordance with contiguous or otherwise similar channel configurations (e.g., channels formed from a contiguous pillar of a semiconductor material), gate configurations (e.g., activation line configurations, or other configurations. For example, pillar selection transistors may include a charge-trapping structure similar to charge trapping structures 120, or dielectric materials similar to dielectric materials 125, among other similarities with transistors 110 or other transistors of memory cells 105 of the pillars. In some examples, charge-trapping structures of pillar selection transistors may be charged (e.g., written, programmed) with an initial charge (e.g., during a manufacturing operation, during a configuration operation), which may establish a relatively lower threshold voltage for activating a channel of the pillar selection transistor. However, in some examples, the initial charge may change (e.g., increase, decrease, leak, degrade), which may change a threshold voltage of the pillar selection transistors (e.g., increasing the threshold voltage to a relatively higher threshold voltage).

In accordance with examples as described herein, a memory device 100 may be configured to monitor threshold voltage characteristics of pillar selection transistors, which may include evaluations relative to certain subsets of the pillar selection transistors. For example, an activation voltage may be applied to gates of the pillar selection transistors to determine whether threshold voltages associated with each subset of the pillar selection transistors have shifted. In some cases, determining whether threshold voltages of each subset of pillar selection transistors have shifted may include determining whether an access parameter has been satisfied. For example, an access parameter may be associated with a duration to program the memory cells 105 corresponding to a subset of pillar selection transistors, such that a relatively long duration to program the memory cells 105 may indicate that channels associated with the pillar selection transistors have become less conductive for a given activation voltage. In some examples, the access parameter may be associated with an aggregate value associated with the subset of pillar selection transistors, such that a relatively high aggregate value may indicate greater degradation of the subset of pillar selection transistors. In some implementations, such evaluations may include comparing access parameters between one subset of pillar selection transistors and another subset of pillar selection transistors. Evaluating certain subsets of the pillar selection transistors of a block may support a more-detailed understanding of degradation than an aggregate evaluation of pillar selection transistors of a block, which may provide an earlier indication of degradation and improve reliability by retiring or otherwise modifying operation of memory blocks.

Figure 2:
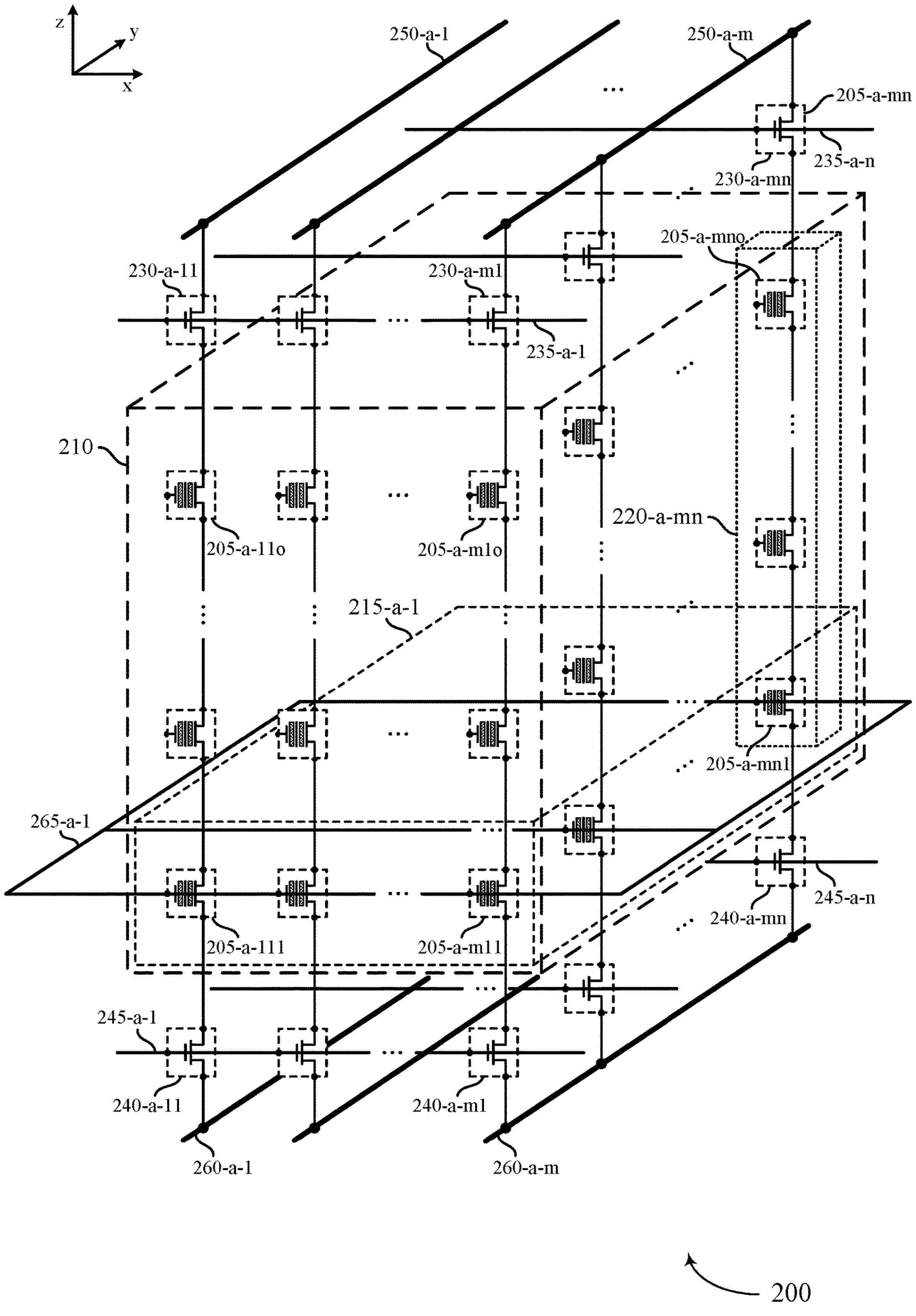
FIG. 2 illustrates an example of a memory architecture that supports memory pillar selection transistor evaluation in accordance with examples as disclosed herein.
Figure 3A:
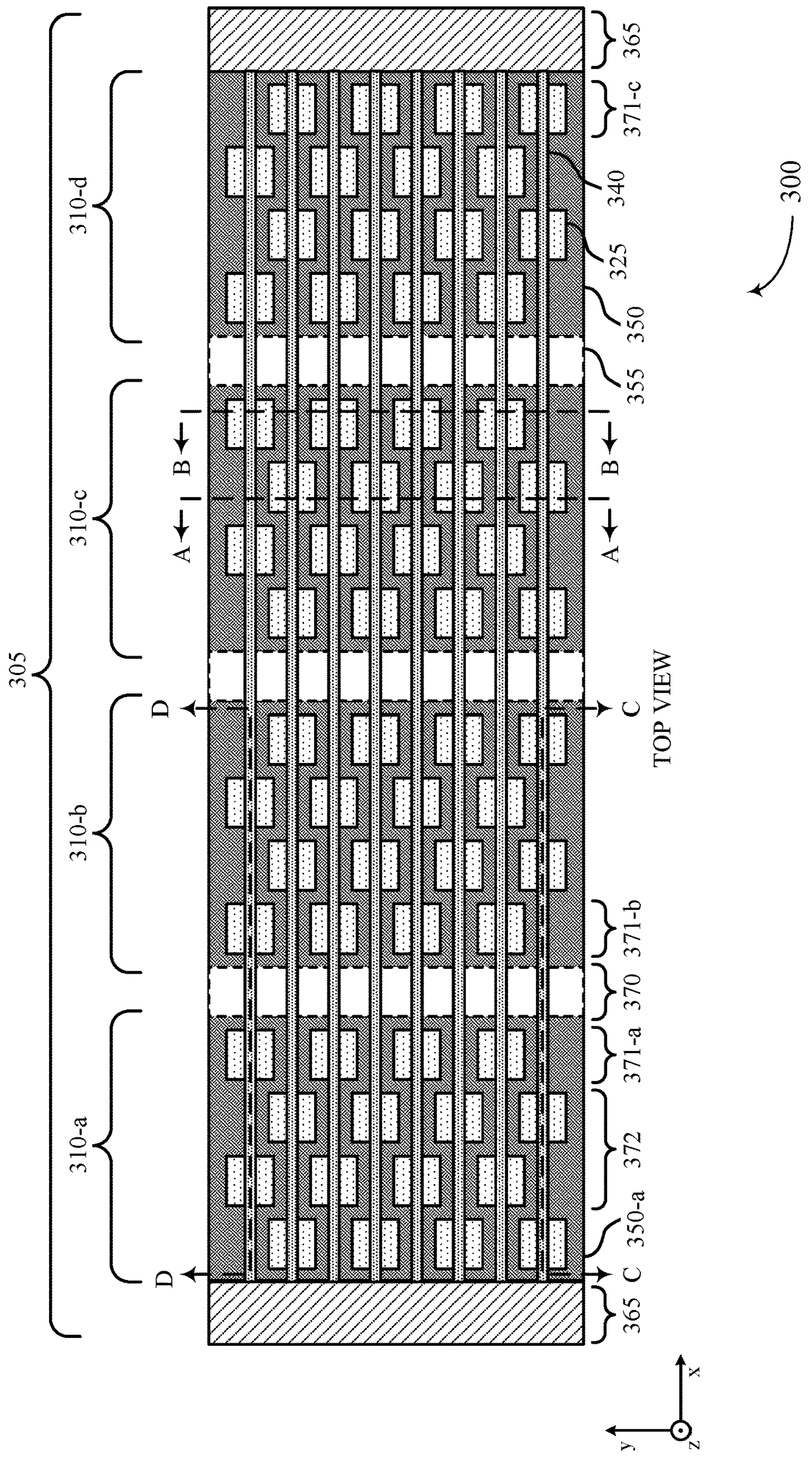
FIGS. 3A through 3E illustrate an example of a memory architecture that supports memory pillar selection transistor evaluation in accordance with examples as disclosed herein.
Figure 3B:
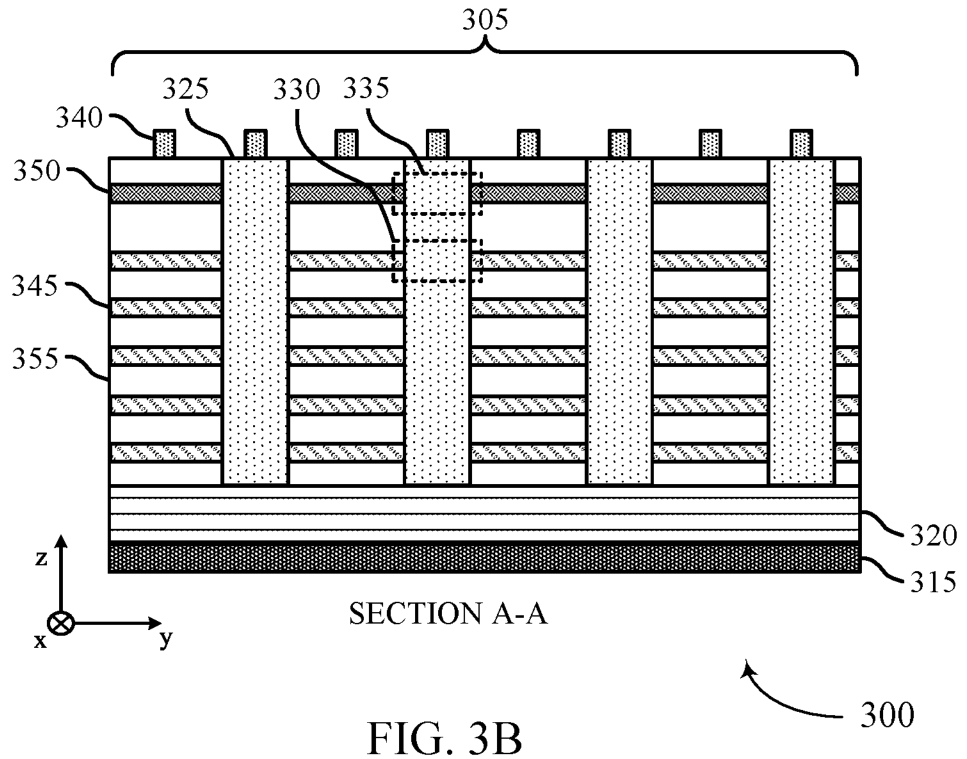
Figure 3C:
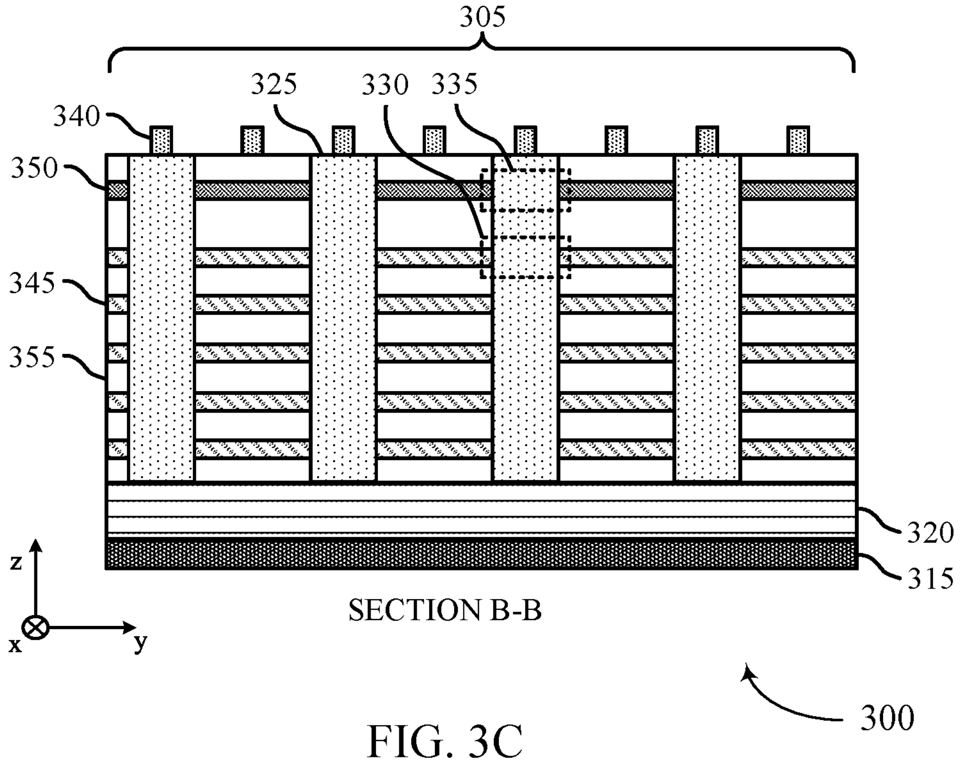
Figure 3D:
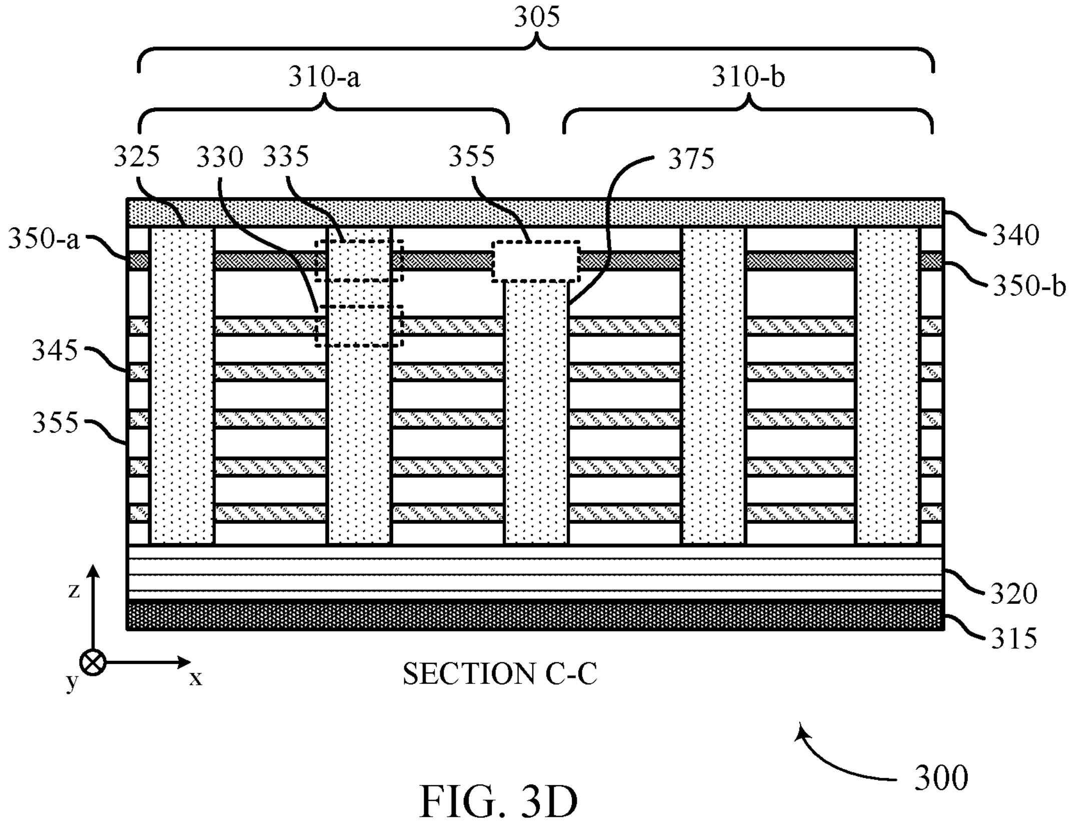
Figure 3E:
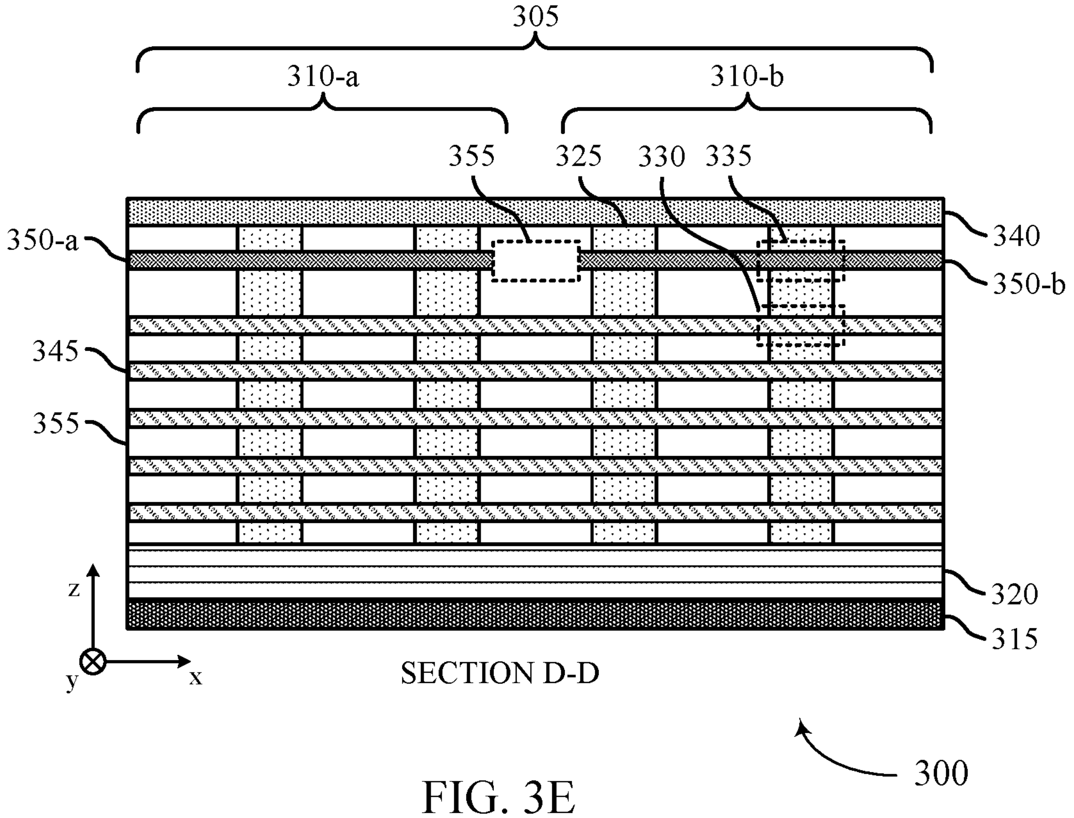

FIG. 2 illustrates an example of a memory architecture 200 that supports memory pillar selection transistor evaluation in accordance with examples as disclosed herein. The memory architecture 200 may be an example of a portion of a memory device, such as a memory device 100. Although some elements of a set of elements (e.g., an array of elements) are included in FIG. 2, some elements may be omitted for the sake of visibility and clarity of the depicted elements. Moreover, although some elements included in FIG. 2 are labeled with reference numbers, some other corresponding elements are not labeled, though they would be understood by a person having ordinary skill in the art to be the same as or similar to the labeled elements. Aspects of the memory architecture 200 may be described with reference to an x-direction, a y-direction, and a z-direction of the illustrated coordinate system.

The memory architecture 200 includes a three-dimensional array of memory cells 205, which may be examples of memory cells 105 described with reference to FIG. 1 (e.g., transistors 110, NAND memory cells). In some examples, the memory cells 205 may be connected in a 3D NAND configuration. For example, the memory cells 205 may be included in a block 210, which may be arranged as a 3D array of m memory cells along the x-direction, n memory cells along the y-direction, and o memory cells along the z-direction. Each memory cell 205 may be located (e.g., addressed) in accordance with an index i along the x-direction, an index j along the y-direction, and an index k along the z-direction (e.g., for locating a memory cell 205-*a*-*ijk*). A memory device 100 may include any quantity of one or more blocks 210 in accordance with examples as disclosed herein, and different blocks 210 may be adjacent along the x-direction, along the y-direction, or along the z-direction, or any combination thereof. In some examples, a block 210 may be divided into a set of two or more subblocks (not shown), which may refer to one or more divisions of the block 210 across a yz-plane (e.g., subblocks arranged along the x-direction). In some examples, aspects of such subblocks may be separated from one another (e.g., along the x-direction) by isolation regions (e.g., trench isolation regions, dummy pillars) of a given block 210, whereas some other aspects of such subblocks may be shared or contiguous between subblocks of a given block 210.

In the example of memory architecture 200, the block 210 may be divided into a set of pages 215 (e.g., a quantity of o pages 215) along the z-direction, including a page 215-*a*-1 associated with memory cells 205-*a*-111 through 205-*a*-*mn*1. In some examples, each page 215 may be associated with a same word line 265, (e.g., a word line 165 described with reference to FIG. 1), which may be coupled with a control gate 115 of each of the memory cells 205 of the page 215. For example, page 215-*a*-1 may be associated with a word line 265-*a*-1, and other pages 215-*a*-*i* may be associated with a different respective word line 265-*a*-*i* (not shown). In some examples, a word line 265 in accordance with the memory architecture 200 may be implemented as planar conductor (e.g., in an xy-plane) that is coupled with each of the memory cells 205 of the page 215.

In the example of memory architecture 200, the block 210 also may be divided into a set of strings 220 (e.g., a quantity of (m×n) strings 220) in an xy-plane, including a string 220-*a*-*mn* associated with memory cells 205-*a*-*mn*1 through 205-*a*-*mno*. In some examples, each string 220 may include a set of memory cells 205 connected in series (e.g., along the z-direction, in which a drain of one memory cell 205 in the string 220 may be coupled with a source of another memory cell 205 in the string 220). In some examples, memory cells 205 of a string 220 may be implemented along a common channel, such as a pillar (e.g., a columnar channel, a pillar of doped semiconductor) along the z-direction. Each memory cell 205 in a string 220 may be associated with a different word line 265, such that a quantity of word lines 265 in the memory architecture 200 may be equal to the quantity of memory cells 205 in a string 220. Accordingly, a string 220 may include memory cells 205 from multiple pages 215, and a page 215 may include memory cells 205 from multiple strings 220.

In some examples, memory cells 205 may be programmed (e.g., set to a logic 0 value) and read from in accordance with a granularity, such as at the granularity of the page 215 or portion thereof, but may not be erasable (e.g., reset to a logic 1 value) in accordance with the granularity, such as the granularity of the page 215 or portion thereof. For example, NAND memory may instead be erasable in accordance with a different (e.g., higher) level of granularity, such as at the level of granularity the block 210. In some cases, a memory cell 205 may be erased before it may be re-programmed. Different memory devices may have different read, write, or erase characteristics.

In some examples, each string 220 of a block 210 may be coupled with a respective transistor 230 (e.g., a string select transistor, a drain select transistor, a pillar selection transistor, transistor 230-*a*-11, transistor 230-*a*-*m*1, transistor 230-*a*-*mn*) at one end of the string 220 (e.g., along the z-direction) and a respective transistor 240 (e.g., a source select transistor, a ground select transistor, transistor 240-*a*-11, transistor 240-*a*-*m*1, transistor 240-*a*-*mn*) at the other end of the string 220. In some examples, a drain of each transistor 230 may be coupled with a bit line 250 (e.g., bit line 250-*a*-1, bit line 250-*a*-*m*) of a set of bit lines 250 associated with the block 210, where the bit lines 250 may be examples of bit lines 155 described with reference to FIG. 1. A gate of each transistor 230 may be coupled with a select line 235 (e.g., a string select line, a drain select line, a pillar select line, select line 235-*a*-1, select line 235-*a*-*n*). Thus, a transistor 230 may be used to couple a string 220 with a bit line 250 based on applying a voltage to the select line 235, and thus to the gate of the transistor 230. Although illustrated as separate lines along the x-direction, in some examples, select lines 235 may be common to different sets of transistors 230 associated with the block 210. For example, like the word lines 265 of the block 210, select lines 235 associated with the block 210 may, in some examples, be implemented as a planar conductor (e.g., in an xy-plane) that is coupled with each of the transistors 230 associated with the block 210. In some other examples, select lines 235 may be implemented as a planar conductor (e.g., in an xy-plane) that is coupled with each of the transistors 230 associated with a subblock, and each subblock may include a separately-addressable aplanar conductor.

In some examples, a source of each transistor 240 associated with the block 210 may be coupled with a source line 260 (e.g., source line 260-*a*-1, source line 260-*a*-*m*) of a set of source lines 260 associated with the block 210. In some examples, the set of source lines 260 may be associated with a common source node (e.g., a ground node) corresponding to the block 210. A gate of each transistor 240 may be coupled with a select line 245 (e.g., a source select line, a ground select line, select line 245-*a*-1, select line 245-*a*-*n*). Thus, a transistor 240 may be used to couple a string 220 with a source line 260 based on applying a voltage to the select line 245, and thus to the gate of the transistor 240. Although illustrated as separate lines along the x-direction, in some examples, select lines 245 also may be common to all the transistors 240 associated with the block 210 (e.g., a commonly biased ground select node). For example, like the word lines 265 of the block 210, select lines 245 associated with the block 210 may, in some examples, be implemented as a planar conductor (e.g., in an xy-plane) that is coupled with each of the transistors 240 associated with the block 210.

To operate the memory architecture 200 (e.g., to perform a program operation, a read operation, or an erase operation on one or more memory cells 205 of the block 210), various voltages may be applied to one or more select lines 235 (e.g., to the gate of the transistors 230), to one or more bit lines 250 (e.g., to the drain of one or more transistors 230), to one or more word lines 265, to one or more select lines 245 (e.g., to the gate of the transistors 240), to one or more source lines 260 (e.g., to the source of the transistors 240), or to a bulk for the memory cells 205 (not shown) of the block 210. In some cases, each memory cell 205 of a block 210 may have a common bulk, the voltage of which may be controlled independently of bulks for other blocks 210.

In some cases, as part of a read operation for a memory cell 205, a positive voltage may be applied to the corresponding bit line 250 while the corresponding source line 260 may be grounded or otherwise biased at a voltage lower than the voltage applied to the bit line 250. In some examples, voltages may be concurrently applied to the select line 235 and the select line 245 that are above the threshold voltages of the transistor 230 and the transistor 240, respectively, for the memory cell 205, thereby activating the transistor 230 and transistor 240 such that a channel associated with the string 220 that includes the memory cell 205 (e.g., a pillar channel) may be electrically connected with (e.g., electrically connected between) the corresponding bit line 250 and source line 260. A channel may be an electrical path through the memory cells 205 in the string 220 (e.g., through the sources and drains of the transistors in the memory cells 205 of the string 220) that may conduct current under some operating conditions.

In some examples, multiple word lines 265 (e.g., in some cases all word lines 265) of the block 210—except a word line 265 associated with a page 215 of the memory cell 205 to be read—may concurrently be set to a voltage (e.g., VREAD) that is higher than the threshold voltage (VT) of the memory cells 205. VREAD may cause all memory cells 205 in the unselected pages 215 be activated so that each unselected memory cell 205 in the string 220 may maintain high conductivity within the channel. In some examples, the word line 265 associated with the memory cell 205 to be read may be set to a voltage, VTarget. Where the memory cells 205 are operated as SLC memory cells, VTarget may be a voltage that is between (i) VT of a memory cell 205 in an erased state and (ii) VT of a memory cell 205 in a programmed state.

When the memory cell 205 to be read exhibits an erased VT (e.g., VTarget>VT of the memory cell 205), the memory cell 205 may turn "ON" in response to the application of VTarget to the word line 265 of the selected page 215, which may allow a current to flow in the channel of the string 220, and thus from the bit line 250 to the source line 260. When the memory cell 205 to be read exhibits a programmed VT (e.g., VTarget<VT of the selected memory cell), the memory cell 205 may remain "OFF" despite the application of VTarget to the word line 265 of the selected page 215, and thus may prevent a current from flowing in the channel of the string 220, and thus from the bit line 250 to the source line 260.

A signal on the bit line 250 for the memory cell 205 (e.g., an amount of current below or above a threshold) may be sensed (e.g., by a sense component 170 as described with reference to FIG. 1), and may indicate whether the memory cell 205 became conductive or remained non-conductive in response to the application of VTarget to the word line 265 of the selected page 215. The sensed signal thus may be indicative of whether the memory cell 205 was in an erased state (e.g., storing a logic 1) or a programmed state (e.g., storing a logic 0). Though aspects of the example read operation above have been explained in the context of an SLC memory cell 205 for clarity, such techniques may be extended or altered and applied in the context of a multiple-level memory cell 205 (e.g., through the use of multiple values of VTarget corresponding to the different amounts of charge that may be stored in one multiple-level memory cell 205).

In some cases, as part of a program operation for a memory cell 205, charge may be added to a portion of the memory cell 205 such that current flow through the memory cell 205, and thus the corresponding string 220, may be inhibited when the memory cell 205 is later read. For example, charge may be injected into a charge trapping structure 120 as shown in memory cell 105-*a* of FIG. 1. In some cases, respective voltages may be applied to the word line 265 of the page 215 and the bulk of the memory cell 205 to be programmed such that a control gate 115 of the memory cell 205 is at a higher voltage than the bulk of the memory cell 205 (e.g., a positive voltage may be applied to the word line). Concurrently, voltages may be applied to the select line 235 and the select line 245 that are above the threshold voltages of the transistor 230 and the transistor 240, respectively, thereby activating the transistor 230 and the transistor 240, and the bit line 250 for the memory cell 205 to be programmed may be set to a relatively high voltage. This may cause an electric field such that electrons are pulled from the source of the memory cell 205 towards the drain. The electric field may also cause some of these electrons to be pulled through dielectric material 125 and thereby injected into the charge trapping structure 120 of the memory cell 205, through a process which may in some cases be referred to as tunnel injection.

In some cases, a single program operation may program some or all memory cells 205 in a page 215, as the memory cells 205 of the page 215 may all share a common word line 265 and a common bulk. For a memory cell 205 of the page 215 for which it is not desired to write a logic 0 (e.g., not desired to program the memory cell 205), the corresponding bit line 250 may be set to a relatively low voltage (e.g., ground), which may inhibit the injection of electrons into a charge trapping structure 120. Though aspects of the example program operation above have been explained in the context of an SLC memory cell 205 for clarity, such techniques may be extended and applied to the context of a multiple-level memory cell 205 (e.g., through the use of multiple programming voltages applied to the word line 265, or multiple passes or pulses of a programming voltage applied to the word line 265, corresponding to the different amounts of charge that may be stored in one multiple-level memory cell 205).

In some cases, as part of an erase operation for a memory cell 205, charge may be removed from a portion of the memory cell 205 such that current flow through the memory cell 205, and thus the corresponding string 220, may be uninhibited (e.g., allowed, at least to a greater extent) when the memory cell 205 is later read. For example, charge may be removed from a charge trapping structure 120 as shown in memory cell 105-*a* of FIG. 1. In some cases, respective voltages may be applied to the word line 265 of the page 215 and the bulk of the memory cell 205 to be erased such that a control gate 115 of the memory cell 205 is at a lower voltage than the bulk of the memory cell 205 (e.g., a positive voltage may be applied to the bulk), which may cause an electric field that pulls electrons out of the charge trapping structure 120 and into the bulk of the memory cell 205. In some cases, a single program operation may erase all memory cells 205 in a block 210, as the memory cells 205 of the block 210 may all share a common bulk.

In some cases, electron injection and removal processes associated with program and erase operations may cause stress on a memory cell 205 (e.g., on the dielectric material 125). Over time, such stress may in some cases cause one or more aspects of the memory cell 205 (e.g., the dielectric material 125) to deteriorate. For example, charge trapping structure 120 may become unable to maintain a stored charge (e.g., leak charge). Such deterioration may be an example of a wearout mechanism for a memory cell 205, and for this or other reasons, some memory cells 205 may support a finite quantity of program and erase cycles.

In accordance with examples as described herein, a memory system that implements the memory architecture 200 may be configured to monitor threshold voltage characteristics of the transistors 230, which may include evaluations relative to certain subsets of the transistors 230. For example, an activation voltage may be applied to select lines 235 to determine whether the threshold voltages associated with each subset of transistors 230 have shifted. In some cases, determining whether the threshold voltages of each subset of transistors 230 have shifted may include determining whether an access parameter has been satisfied. For example, an access parameter may be associated with a duration to program the memory cells 205 corresponding to a subset of transistors 230 (e.g., a subset of strings 220), such that a relatively long duration to program the memory cells 205 may indicate that channels associated with the transistors 230 have become less conductive for a given activation voltage. In some examples, the access parameter may be associated with an aggregate value (e.g., an average value, a minimum value, a maximum value) associated with the subset of transistors 230, such that a relatively high aggregate value may indicate greater degradation of the subset of transistors 230. In some implementations, such evaluations may include comparing access parameters between one subset of transistors 230 (e.g., one subset of strings 220) and another subset of transistors 230 (e.g., another subset of strings 220). Evaluating certain subsets of the transistors 230 of a block 210 may support a more-detailed understanding of degradation than an aggregate evaluation of transistors 230 of a block 210, which may provide an earlier indication of degradation and improve reliability by retiring or otherwise modifying operation of memory blocks.

FIGS. 3A through 3E illustrate an example of a memory architecture 300 that supports memory pillar selection transistor evaluation in accordance with examples as disclosed herein. The memory architecture 300 may be an example for implementing aspects of a memory device 100 or a memory architecture 200. Aspects of the memory architecture 300 may be described with reference to an x-direction, a y-direction, and a z-direction of the illustrated coordinate system, where the z direction may be illustrative of a direction (e.g., a vertical direction, height direction, a thickness direction) that is orthogonal to or otherwise relative to (e.g., away from) a surface in an xy-plane (e.g., a substrate 315) of the memory architecture 300. Although FIGS. 3A through 3E illustrate examples of relative dimensions and quantities of various features, aspects of a memory architecture 300 may be implemented with other relative dimensions or quantities of such features in accordance with examples as disclosed herein. Further, some elements of the memory architecture 300 may be omitted for the sake of clarity of the depicted elements. Although some elements included in FIG. 3A-3E are labeled with reference numbers, some other corresponding elements are not labeled, though they would be understood by a person having ordinary skill in the art to be the same as or similar to the labeled elements.

The memory architecture 300 illustrates a three-dimensional architecture of a block 305, which may be an example of a block 210. The block 305 may be included in a set of blocks 305 of a memory device 100 that implements a memory architecture 200. The block 305 may include a set of subblocks 310 (e.g., subblocks 310-*a*, 310-*b*, 310-*c*, and 310-*d*) formed above (e.g., along the z-direction) a substrate 315 and supporting circuitry 320 (e.g., voltage supply circuitry, decoding circuitry, access line circuitry, controller circuitry, among other circuitry) that, in some examples, may be formed at least in part from doped portions of or otherwise overlap (e.g., along the z-direction) the substrate 315.

Each subblock 310 may include a respective set of pillars 325, and each pillar 325 may support a string 220 (e.g., a string of memory cells 205, a pillar of memory cells 205). The pillars 325 may extend along the z-direction and may be arranged in a pattern in an xy-plane (e.g., a rectangular pattern, a hexagonal pattern, a staggered patterned), such as in rows each extending along the x-direction and columns each extending along the y-direction. Each pillar 325 may support a semiconductor channel along the z-direction (e.g., a vertical channel), which may be coupled with the circuitry 320 (e.g., directly, via transistors 240 that may be included in the pillars 325 or in the circuitry 320). Each pillar 325 may include a set of memory cells 330 along the z-direction, each of which may be an example of a memory cell 205. For example, each memory cell 330 may be or include a transistor (e.g., a transistor 110) including a charge trapping structure, such that an amount of charge stored by the charge trapping structure may be indicative of a logic value at the memory cell 330.

Each pillar 325 also may support a respective pillar selection transistor 335, which may be an example of a transistor 230. Each pillar selection transistor 335 may also be a transistor (e.g., similar to a transistor 110) including a charge trapping structure. In some examples, pillar selection transistors 335 may share a configuration (e.g., a material configuration, a transistor configuration) with the memory cells 330. For example, a pillar selection transistor 335 and a set of memory cells 330 may share one or more materials of a pillar 325 (e.g., a semiconductor material, a dielectric material, a charge-trapping material), which may be contiguous along the z-direction.

A block 305 may be associated with a set of bit lines 340, which may be examples of bit lines 250, that are operable for coupling with at least memory cells 330 of the pillars 325. Each bit line 340 may extend along the x-direction (e.g., spanning at least one block 305), and may be coupled with at least one pillar 325 (e.g., each pillar 325) in a respective row of the pillars 325. Although the example of memory architecture 300 illustrates an example where each bit line 340 may be operable to couple with two pillars 325 in a given subblock 310, in some other examples, a bit line 340 may be operable to couple with another quantity of pillars 325 of a given subblock 310. For example, a bit line 340 may be operable to couple with a single pillar 325 in a given subblock 310, which may facilitate some addressing or decoding configurations.

A block 305 also may include a set of word lines 345 coupled with the pillars 325, which may be examples of word lines 265 (e.g., supporting a wrap-around gate portion of transistors 110 of memory cells 330, wrapping around pillars 325). Each word line 345 may be arranged as a planar conductor in an xy-plane, and word lines 345 of the block 305 may be stacked along the z-direction (e.g., between layers of insulating material 355). Each word line 345 may span the block 305 (e.g., along the x-direction and the y-direction) such that each word line 345 is coupled with each pillar 325 of the block 305. The block 305 may also include a set of selection conductors 350 coupled with the pillars 325, which may be examples of select lines 235 (e.g., supporting a wrap-around gate portion of pillar selection transistors 335, wrapping around pillars 325). Each selection conductor 350 may be arranged as a planar conductor in an xy-plane and may span a respective subblock 310 (e.g., along the x-direction and the y-direction), such that a selection conductor 350 of one subblock 310 may not be coupled with pillars 325 of another (e.g., adjacent) subblock 310. In some implementations, an insulating material may be located between the selection conductors 350 and the bit lines 340, but such an insulating material may be omitted from the view of FIG. 3A to illustrate an example of the extents of selection conductors 350 for each subblock 310.

A block 305 may include isolation regions 365 and isolation regions 370 (e.g., trench isolation regions, isolation regions extending along the y-direction), which may provide electrical isolation between features of the memory architecture 300. Isolation regions 365 may be formed at extents (e.g., along the x-direction) of the block 305, and may be formed by forming trenches through (e.g., along the z-direction) at least a portion of the block 305 to isolate (e.g., bound) word lines 345 of the block 305, such that each word line 345 may be confined to the block 305 and may be isolated from features of adjacent blocks 305. Isolation regions 370 may be formed between subblocks 310, and may be formed by forming trenches through at least a portion of the block 305 (e.g., along the z-direction) to isolate each selection conductor 350 to a respective subblock 310. An isolation region 370 may include an insulating material 355, which may be deposited over one or more dummy pillars 375. In some examples, dummy pillars 375 may be formed with one or more processes that are common with forming pillars 325 (e.g., pillar etch operations, pillar fill operations), which may support aspects of processing or structural uniformity across the block 305. In some examples, at least a portion of dummy pillars 375 (e.g., a top portion along the z-direction) may be removed during a trenching operation to form isolation regions 370, and dummy pillars 375 may be isolated from bit lines 340 and selection conductors 350 by the insulating material 355. In some examples, dummy pillars 375 may be structural features that are configured with different material (e.g., a dielectric material) than the pillars 325.

Aspects of the block 305 may described with reference to edge regions 371 (e.g., edge regions 371-*a*, 371-*b*, and 371-*c*), which may be associated with columns of pillars 325 and corresponding pillar selection transistors 335 that are adjacent (e.g., along the x-direction) to isolation regions 365 and 370 (e.g., edge regions of subblocks 310). Aspects of the block 305 may also be described with reference to central regions 372, which may be associated with columns of pillars 325 and corresponding pillar selection transistors 335 that are not adjacent to the isolation regions 365 and 370 (e.g., central regions of subblocks 310). However, in some other examples, aspects of the block 305 may be described with different regions that group features of the block 305 in accordance with different characteristics.

Accessing (e.g., writing, reading) memory cells 330 may include selecting one or more pillars 325 associated with the memory cells 330. Selecting pillars 325 may include applying an activation voltage to gates of the pillar selection transistors 335 associated with the pillars 325 (e.g., via a selection conductor 350). For example, to select pillars 325 of the subblock 310-*a*, an activation voltage may be applied to the selection conductor 350-*a* that corresponds to the subblock 310-*a*. The activation voltage may thus be applied to respective gates of the pillar selection transistors 335, and respective channels of the pillar selection transistors 335 may become conductive if the activation voltage is greater than or equal to a threshold voltage associated with the pillar selection transistors 335.

In some examples, if pillar selection transistors 335 include charge trapping structures, an initial amount of charge may be stored in the charge trapping structures (e.g., during a manufacturing operation, during a configuration operation) such that the activation voltage (e.g., an activation voltage magnitude) to enable channel conductivity between bit lines 340 and pillars 325 may be relatively low (e.g., due to a relatively lower threshold voltage of the pillar selection transistors 335 enabled by the stored charge). However, in some such examples, if an amount of stored charge changes (e.g., due to charge depletion), the activation voltage to enable channel conductivity may change to be relatively higher. In some cases, if an activation voltage is less than the threshold voltage associated with the pillar selection transistors 335, channels of the pillar selection transistors 335 may not be conductive enough to support access operations, such as read operations or write operations. Although degradation of pillar selection transistors 335 may be related to such changes of charge stored in charge trapping structures of the pillar selection transistors 335, changes in threshold voltage or other degradation of pillar selection transistors 335 that may be evaluated in accordance with the described techniques may be related to other phenomena.

In some examples, degradation of pillar selection transistors 335, such as changes in threshold voltages or other changes, may occur relatively faster, or to a greater extent, for pillar selection transistors 335 that are near isolation regions 365 and 370, among other different locations or physical addresses of a block 305. For example, pillar selection transistors 335 in edge regions 371 may be associated with relatively faster or greater changes in threshold voltages (e.g., relatively faster or greater changes in charge stored in charge trapping structures) compared to pillar selection transistors 335 in central regions 372. In accordance with examples as described herein, the degradation of the pillar selection transistors 335 may be evaluated based on different regions of the pillar selection transistors 335. For example, a degradation of a first subset of pillar selection transistors 335 corresponding to one or more edge regions 371 (e.g., of a block 305, of a set of blocks 305) may be evaluated independently of or otherwise comparatively to a degradation of a second subset of pillar selection transistors 335 corresponding to one or more central regions 372. To support such evaluations, an activation voltage may be applied to pillar selection transistors 335 of one or more subblocks 310 (e.g., the subblock 310-*a*) via respective selection conductors 350 (e.g., the selection conductor 350-*a*) and an access parameter for each subset of pillar selection transistors 335 may be monitored (e.g., evaluated, compared) based on applying the activation voltage.

In some examples of the described evaluation techniques, an access parameter for a first subset of pillar selection transistors 335 of one or more blocks 305 may be compared with an access parameter for a second subset of pillar selection transistors 335 of the same one or more blocks 305, which may support determining a relative or differential degradation of the first subset or the second subset of pillar selection transistors 335. For example, if an access parameter is similar between subsets of pillar selection transistors 335, a degradation or absence of degradation may be similar for the subsets of pillar selection transistors 335. However, if an access parameter for a first subset of pillar selection transistors 335 is different than (e.g., greater than, less than) an access parameter for a second subset of pillar selection transistors, a level of degradation for the first subset of pillar selection transistors 335 may be different than a level of degradation for the second subset of pillar selection transistors 335. In some implementations, comparing the first access parameter with the second access parameter may include determining whether a difference between the first access parameter and the second access parameter satisfies a threshold (e.g., a threshold difference between access parameters). In some other cases, each access parameter may be compared to a threshold, and one subset of pillar selection transistors 335 satisfying the threshold may indicate the level of degradation of the respective subset of pillar selection transistors 335 is relatively high.

In some examples, an access parameter that supports the described evaluations may include a threshold voltage parameter associated with the threshold voltages of the respective subset of pillar selection transistors 335. For example, each subset of pillar selection transistors 335 may be associated with an aggregate value of detected threshold voltages for the respective subset of pillar selection transistors 335, such as an average threshold voltage, a minimum threshold voltage, or a maximum threshold voltage. In some implementations, determining threshold voltages may include applying activation voltages of different levels to the pillar selection transistors 335 (e.g., in a pattern of increasing or decreasing activation voltages) and evaluating channel conductivity of the pillar selection transistors 335 (e.g., whether a channel conductivity satisfies a threshold, whether a current through the pillar selection transistors 335 satisfies a threshold) during application of the activation voltage at different levels.

In some examples, an access parameter that supports the described evaluations may include a programming duration associated with the threshold voltages of the respective subset of pillar selection transistors 335, which may be monitored by performing a "slow-to-program" evaluation of subsets of associated memory cells 330. For example, each subset of pillar selection transistors 335 may be associated with a duration for successfully programming one or more memory cells 330 of pillars 325 coupled with bit lines 340 by the pillar selection transistors 335. In some examples, such a duration may be associated with a quantity of programming cycles (e.g., write operations) that are performed until a programming is validated, where each cycle may include applying a write pulse to one or more memory cells 330 while an activation voltage is applied to a selection conductor 350 and evaluating whether the memory cells 330 have been successfully programmed. In some examples, such programming cycles may be repeated until at least some, if not all memory cells 330 under evaluation are successfully programmed, and a quantity of such programming cycles may be associated with subsets of the pillar selection transistors 335. In some such implementations, an activation voltage applied to selection conductors 350 may be different than (e.g., lower) than an activation voltage applied during normal access operations. In some examples, a relatively longer programming duration (e.g., a higher quantity of programming cycles) may indicate a restriction of write pulses, which may be associated with a relatively lower channel conductivity of pillar selection transistors 335 for a given activation voltage, thereby indicating a degradation of the pillar selection transistors 335.

In some cases, an access parameter may be determined based on a set of locations (e.g., physical addresses, bit positions) for a respective subset of pillar selection transistors 335. For example, to support an evaluation of or between edge regions 371 and central regions 372, bit positions or physical addresses for separate evaluations may be mapped respectively to one or more edge regions 371 and one or more central regions. In some examples, such techniques may support a spatial filtering of evaluations between subsets of pillar selection transistors 335.

In some examples, such spatial filtering may be implemented in accordance with a data mask that supports evaluations of different subsets of pillar selection transistors 335, such as different implementations of a slow-to-program evaluation. For example, a first data pattern for a first programming duration evaluation may be configured such that a first subset of memory cells 330, corresponding to a first subset of pillar selection transistors 335, are written with a logic state (e.g., a logic 1, a logic state not corresponding to an erased state). Such a data pattern may, for example, target writing memory cells 330 in central regions 372 (e.g., as a 'middle pillar' pattern, as a 0xBB/0xDD data pattern or other bit pattern). A second data pattern for a second programming duration evaluation may be configured such that a second subset of memory cells 330, corresponding to a second subset of pillar selection transistors 335, are written with a logic state (e.g., a same logic state as the first programming duration evaluation). Such a data pattern may, for example, target writing memory cells 330 in edge regions 371 (e.g., as an 'edge pillar' pattern, as a 0x66 data pattern or other bit pattern). In various examples, the second programming duration evaluation may be performed after or before performing the first programming duration evaluation. However, the data pattern of the latter of the programming duration evaluations may also include the logic state being written (e.g., rewritten) to the target memory cells 330 of the earlier of the programming duration evaluations to facilitate the validity evaluation of the latter of the programming duration evaluations (e.g., to avoid memory cells 330 written in the earlier of the programming duration evaluations inadvertently indicating an invalid programming of the latter of the programming duration evaluations).

By performing programming duration evaluations in accordance with the first data pattern and the second data pattern (e.g., data patterns that implement a positional separation of logic state writing), respective programming durations may be determined for the different subsets of pillars 325 (e.g., pillar selection transistors 335). In some implementations (e.g., because the first and second programming duration evaluations are not associated with user data), the first and second programming duration evaluations may be performed without an erase operation between them (e.g., assuming that memory cells 330 written in the first programming duration evaluation remain successfully programmed), which may reduce time and memory cell fatigue compared to other techniques.

A memory device 100 may operate a block 305 based on the described evaluations of pillar selection transistors 335, which may include modifying a parameter for operating a block 305 (e.g., from a nominal operating parameter, based on detecting a degradation or differential degradation of pillar selection transistors 335, based on an evaluated access parameter satisfying a threshold, based on identifying a change of threshold voltages of pillar selection transistors 335). In some examples, a block 305 may be assigned with a failed or degraded status, which may be stored in a register associated with the memory device 100 (e.g., based on determining a relatively high level of degradation of a subset of pillar selection transistors 335). In some such examples, a memory device 100 may not perform access operations on the block 305 based on the status of the block 305 stored in the register, or may operate the block 305 in a manner that is different than when the pillar selection transistors 335 are operating nominally. In some implementations, the block 305 may be deactivated (e.g., retired) based on determining a relatively high level of degradation of a subset of pillar selection transistors 335.

In some examples, a block 305 may be operated to avoid accessing certain subsets of pillars 325. For example, when degradation of pillar selection transistors 335 is determined to be relatively higher in edge regions 371, a memory device 100 may refrain from accessing (e.g., writing, reading) memory cells 330 located in edge regions 371, which may involve applying a logical data mask that ignores or avoids accessing certain physical addresses (e.g., certain pillars 325). In some other examples, a memory device 100 may change an activation voltage used to support accessing pillars 325 in regions associated with pillar selection transistors 335 identified as having relatively higher degradation. For example, to overcome charge depletion in charge trapping structures of pillar selection transistors 335, a memory device 100 may increase an activation applied to at least some selection conductors 350 of a given block 305 (e.g., a block 305 determined to have degradation or differential degradation of pillar selection transistors 335) to modify operations of the block 305.

The described evaluation techniques may be initiated in response to various conditions. For example, the degradation evaluation may be performed based on determining that data in the block 305 is invalid (e.g., no longer needed), in which case the block 305 may be available for testing that alters charge stored in memory cells 330 (e.g., erasing or otherwise changing logic states stored in memory cells 330). In some implementations, the degradation evaluation may be associated with performing a garbage collection on the block 305, where performing the garbage collection may include identifying valid data in a source block (e.g., the block 305) and transferring the valid data to a target block such that invalid data remaining in the source block may be erased (e.g., overwritten). The degradation evaluation may be performed in response to transferring the valid data from the source block, which may be followed by erasing the source block prior to performing the described evaluations.

In accordance with examples as described herein, determining the degradation separately for one or more subsets of pillar selection transistors 335 may support greater reliability and decreased process deviations at a memory device 100. For example, by determining the degradation independently for the subset of pillar selection transistors 335, blocks 305 with degradation may be identified relatively earlier and deactivated or otherwise operated differently (e.g., in a modified operational mode), thereby decreasing a likelihood of errors associated with access operations.

Figure 4:
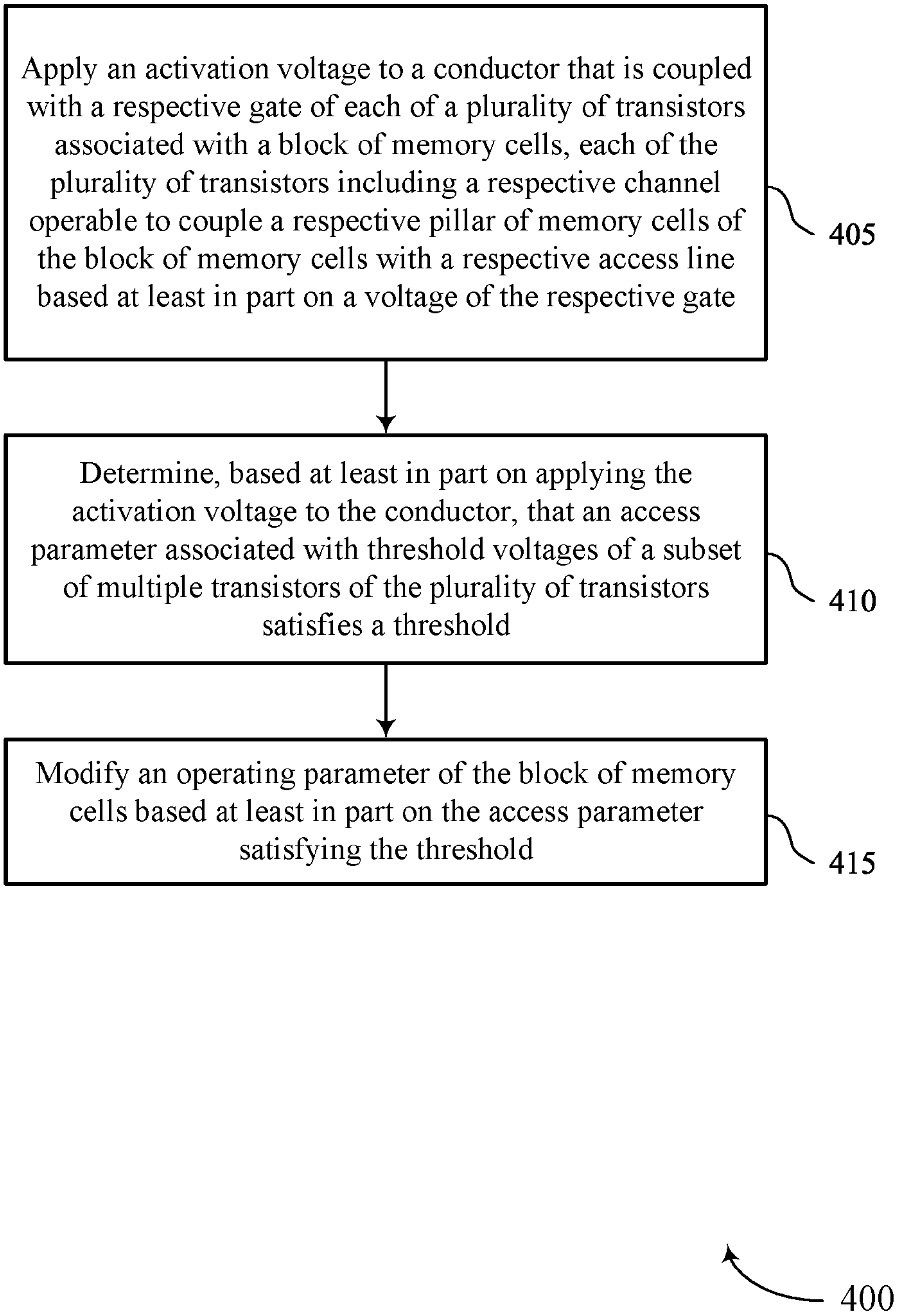
FIG. 4 illustrates a flowchart showing a method or methods that support memory pillar selection transistor evaluation in accordance with examples as disclosed herein.

FIG. 4 illustrates a flowchart showing a method 400 that supports memory pillar selection transistor evaluation in accordance with examples as disclosed herein. The operations of method 400 may be implemented by a memory device or its components as described herein (e.g., a memory device that may be implemented in a memory system). For example, operations of method 400 may be performed by a memory device 100 (e.g., a memory controller 180) as described with reference to FIGS. 1 through 3. In some examples, a memory device may execute a set of instructions to control the functional elements of the device to perform the described functions. Additionally, or alternatively, the memory device may perform aspects of the described functions using special-purpose hardware.

At 405, the method may include applying an activation voltage to a conductor that is coupled with a respective gate of each of a plurality of transistors associated with a block of memory cells, each of the plurality of transistors including a respective channel operable to couple a respective pillar of memory cells of the block of memory cells with a respective access line based at least in part on a voltage of the respective gate. In some cases, applying the activation voltage may be based at least in part on determining to perform degradation evaluation of the block. For example, applying the activation voltage may be based at least in part on detecting invalid data in the block or performing a garbage collection operations on the block. In some cases, the activation voltage may be different than (e.g., greater than, lower than) an activation voltage used for other operations, such as an activation voltage used for access operations (e.g., to read or write data).

At 410, the method may include determining, based at least in part on applying the activation voltage to the conductor, that an access parameter associated with threshold voltages of a subset of multiple transistors of the plurality of transistors satisfies a threshold. In some cases, determining that the access parameter satisfies a threshold is based on comparing the access parameter to a second access parameter associated with threshold voltage of a second subset of multiple transistors of the plurality of transistors.

At 415, the method may include modifying an operating parameter of the block of memory cells based at least in part on the access parameter satisfying the threshold. In some cases, modifying an operating parameter of the block may include deactivating the block or updating a status corresponding to the block in a register associated with operating the block.

In some examples, an apparatus as described herein may perform a method or methods, such as the method 400. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for applying an activation voltage to a conductor that is coupled with a respective gate of each of a plurality of transistors associated with a block of memory cells, each of the plurality of transistors including a respective channel operable to couple a respective pillar of memory cells of the block of memory cells with a respective access line based at least in part on a voltage of the respective gate; determining, based at least in part on applying the activation voltage to the conductor, that an access parameter associated with threshold voltages of a subset of multiple transistors of the plurality of transistors satisfies a threshold; and modifying an operating parameter of the block of memory cells based at least in part on the access parameter satisfying the threshold.

Aspect 2: The method, apparatus, or non-transitory computer-readable medium of aspect 1, where determining that the access parameter satisfies the threshold includes operations, features, circuitry, logic, means, or instructions, or any combination thereof for determining that the access parameter differs from a second access parameter associated with threshold voltages of a second subset of multiple transistors of the plurality of transistors, different than the subset of multiple transistors, by a threshold amount.

Aspect 3: The method, apparatus, or non-transitory computer-readable medium of aspect 2, where determining that the access parameter differs from the second access parameter by the threshold amount includes operations, features, circuitry, logic, means, or instructions, or any combination thereof for determining that a first duration to program first memory cells of the respective pillars associated with the subset of multiple transistors differs from a second duration to program second memory cells of the respective pillars associated with the second subset of multiple transistors by the threshold amount.

Aspect 4: The method, apparatus, or non-transitory computer-readable medium of aspect 3, further including operations, features, circuitry, logic, means, or instructions, or any combination thereof for determining the first duration based at least in part on a quantity of one or more first write operations, based at least in part on applying the activation voltage to the conductor, to write a logic state to the first memory cells and determining the second duration based at least in part on a quantity of one or more second write operations, based at least in part on applying the activation voltage to the conductor, to write the logic state to the second memory cells.

Aspect 5: The method, apparatus, or non-transitory computer-readable medium of aspect 4, further including operations, features, circuitry, logic, means, or instructions, or any combination thereof for performing the one or more second write operations separately from (e.g., after, before) performing the one or more first write operations without an erase operation between the one or more first write operations and the one or more second write operations.

Aspect 6: The method, apparatus, or non-transitory computer-readable medium of any of aspects 2 through 5, where determining that the access parameter differs from the second access parameter by the threshold amount includes operations, features, circuitry, logic, means, or instructions, or any combination thereof for determining that a first threshold voltage parameter associated with the subset of multiple transistors differs from a second threshold voltage parameter associated with the second subset of multiple transistors by the threshold amount.

Aspect 7: The method, apparatus, or non-transitory computer-readable medium of aspect 6, where the first threshold voltage parameter is an average threshold voltage, a minimum threshold voltage, or a maximum threshold voltage of the subset of multiple transistors and the second threshold voltage parameter is an average threshold voltage, a minimum threshold voltage, or a maximum threshold voltage of the second subset of multiple transistors.

Aspect 8: The method, apparatus, or non-transitory computer-readable medium of any of aspects 2 through 7, where determining that the access parameter differs from the second access parameter by the threshold amount is configured with the subset of multiple transistors associated with a first set of bit positions associated with a data bus and the second subset of multiple transistors associated with a second set of bit positions associated with the data bus that is different than the first set of bit positions.

Aspect 9: The method, apparatus, or non-transitory computer-readable medium of any of aspects 2 through 8, where determining that the access parameter differs from the second access parameter by the threshold amount is configured with the subset of multiple transistors located closer to an isolation region of the block of memory cells than the second subset of multiple transistors.

Aspect 10: The method, apparatus, or non-transitory computer-readable medium of any of aspects 1 through 9, where the activation voltage is less than a second activation voltage associated with writing data to the block of memory cells.

Aspect 11: The method, apparatus, or non-transitory computer-readable medium of any of aspects 1 through 10, where for at least one transistor of the plurality of transistors, the respective channel and the respective pillar of memory cells include a contiguous semiconductor material.

Aspect 12: The method, apparatus, or non-transitory computer-readable medium of any of aspects 1 through 11, where at least one transistor of the plurality of transistors includes a charge trapping material between the respective gate and the respective channel.

Aspect 13: The method, apparatus, or non-transitory computer-readable medium of any of aspects 1 through 12, where applying the activation voltage to the conductor is based at least in part on an indication that data of the block of memory cells is invalid.

Aspect 14: The method, apparatus, or non-transitory computer-readable medium of any of aspects 1 through 13, where applying the activation voltage to the conductor is associated with performing a garbage collection operation on the block of memory cells.

Aspect 15: The method, apparatus, or non-transitory computer-readable medium of any of aspects 1 through 14, where modifying the operating parameter includes operations, features, circuitry, logic, means, or instructions, or any combination thereof for deactivating the block of memory cells based at least in part on determining that the access parameter satisfies the threshold.

It should be noted that the described methods include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" (e.g., "electrically coupling") may refer to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials, or combinations thereof. In some examples, one layer or level may be composed of two or more sublayers or sublevels.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally, or alternatively (e.g., in an alternative example), be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:

a block of memory cells comprising a plurality of pillars of memory cells;

a plurality of transistors, each transistor comprising a respective gate and a respective channel operable to couple a respective pillar of the plurality of pillars with a respective access line based at least in part on voltage of the respective gate; and a controller coupled with the block of memory cells and the plurality of transistors, the controller configured to cause the apparatus to:

apply an activation voltage to a conductor that is coupled with the respective gate of each transistor of the plurality of transistors;

determine, based at least in part on applying the activation voltage to the conductor, that an access parameter associated with threshold voltages of a subset of multiple transistors of the plurality of transistors satisfies a threshold; and modify an operating parameter of the block of memory cells based at least in part on the access parameter satisfying the threshold.

2. The apparatus of claim 1, wherein, to determine that the access parameter satisfies the threshold, the controller is configured to cause the apparatus to:
determine that the access parameter differs from a second access parameter associated with threshold voltages of a second subset of multiple transistors of the plurality of transistors, different than the subset of multiple transistors, by a threshold amount.

3. The apparatus of claim 2, wherein, to determine that the access parameter differs from the second access parameter by the threshold amount, the controller is configured to cause the apparatus to:
determine that a first duration to program first memory cells of the respective pillars associated with the subset of multiple transistors differs from a second duration to program second memory cells of the respective pillars associated with the second subset of multiple transistors by the threshold amount.

4. The apparatus of claim 3, wherein the controller is further configured to cause the apparatus to:
determine the first duration based at least in part on a quantity of one or more first write operations, based at least in part on applying the activation voltage to the conductor, to write a logic state to the first memory cells; and
determine the second duration based at least in part on a quantity of one or more second write operations, based at least in part on applying the activation voltage to the conductor, to write the logic state to the second memory cells.

5. The apparatus of claim 4, wherein the controller is further configured to cause the apparatus to:
perform the one or more second write operations separately from the one or more first write operations without an erase operation between the one or more first write operations and the one or more second write operations.

6. The apparatus of claim 2, wherein, to determine that the access parameter differs from the second access parameter by the threshold amount, the controller is configured to cause the apparatus to:
determine that a first threshold voltage parameter associated with the subset of multiple transistors differs from a second threshold voltage parameter associated with the second subset of multiple transistors by the threshold amount.

7. The apparatus of claim 6, wherein the first threshold voltage parameter is an average threshold voltage, a minimum threshold voltage, or a maximum threshold voltage of the subset of multiple transistors and the second threshold voltage parameter is an average threshold voltage, a minimum threshold voltage, or a maximum threshold voltage of the second subset of multiple transistors.

8. The apparatus of claim 2, wherein determining that the access parameter differs from the second access parameter by the threshold amount is configured with the subset of multiple transistors associated with a first set of bit positions associated with a data bus and the second subset of multiple transistors associated with a second set of bit positions associated with the data bus that is different than the first set of bit positions.

9. The apparatus of claim 2, wherein determining that the access parameter differs from the second access parameter by the threshold amount is configured with the subset of multiple transistors located closer to an isolation region of the block of memory cells than the second subset of multiple transistors.

10. The apparatus of claim 1, wherein the activation voltage is less than a second activation voltage associated with writing data to the block of memory cells.

11. The apparatus of claim 1, wherein for at least one transistor of the plurality of transistors, the respective channel and the respective pillar of memory cells comprise a contiguous semiconductor material.

12. The apparatus of claim 1, wherein at least one transistor of the plurality of transistors comprises a charge trapping material between the respective gate and the respective channel.

13. The apparatus of claim 1, wherein applying the activation voltage to the conductor is based at least in part on an indication that data of the block of memory cells is invalid.

14. The apparatus of claim 1, wherein applying the activation voltage to the conductor is associated with performing a garbage collection operation on the block of memory cells.

15. The apparatus of claim 1, wherein to modify the operating parameter, the controller is configured to cause the apparatus to:
deactivate the block of memory cells based at least in part on determining that the access parameter satisfies the threshold.

16. A method, comprising:
applying an activation voltage to a conductor that is coupled with a respective gate of each of a plurality of transistors associated with a block of memory cells, each of the plurality of transistors comprising a respective channel operable to couple a respective pillar of memory cells of the block of memory cells with a respective access line based at least in part on a voltage of the respective gate;
determining, based at least in part on applying the activation voltage to the conductor, that an access parameter associated with threshold voltages of a subset of multiple transistors of the plurality of transistors satisfies a threshold; and
modifying an operating parameter of the block of memory cells based at least in part on the access parameter satisfying the threshold.

17. The method of claim 16, wherein determining that the access parameter satisfies the threshold comprises:
determining that the access parameter differs from a second access parameter associated with threshold voltages of a second subset of multiple transistors of the plurality of transistors, different than the subset of multiple transistors, by a threshold amount.

18. The method of claim 17, wherein determining that the access parameter differs from the second access parameter by the threshold amount comprises:
determining that a first duration to program first memory cells of the respective pillars associated with the subset of multiple transistors differs from a second duration to program second memory cells of the respective pillars associated with the second subset of multiple transistors by the threshold amount.

19. The method of claim 17, wherein determining that the access parameter differs from the second access parameter by the threshold amount comprises:
determining that a first threshold voltage parameter associated with the subset of multiple transistors differs from a second threshold voltage parameter associated with the second subset of multiple transistors by the threshold amount.

20. A non-transitory computer-readable medium storing code comprising instructions which, when executed by a processor of an electronic device, cause the electronic device to:

apply an activation voltage to a conductor that is coupled with a respective gate of each of a plurality of transistors associated with a block of memory cells, each of the plurality of transistors comprising a respective channel operable to couple a respective pillar of memory cells of the block of memory cells with a respective access line based at least in part on a voltage of the respective gate;

determine, based at least in part on applying the activation voltage to the conductor, that an access parameter associated with threshold voltages of a subset of multiple transistors of the plurality of transistors satisfies a threshold; and modify an operating parameter of the block of memory cells based at least in part on the access parameter satisfying the threshold.

* * * * *